(12) United States Patent  
Ooe

(10) Patent No.: US 6,494,133 B2  
(45) Date of Patent: Dec. 17, 2002

(54) SCREEN PRINTING METHOD AND SCREEN PRINTING MACHINE

(75) Inventor: Kunio Ooe, Chiryu (JP)

(73) Assignee: Fuji Machine Mfg. Co., Ltd., Aichi-Ken (JP)

( * ) Notice: Subject to any disclaimer, the term of this patent is extended or adjusted under 35 U.S.C. 154(b) by 0 days.

(21) Appl. No.: 09/749,577

(22) Filed: Dec. 28, 2000

(65) Prior Publication Data

US 2001/0008101 A1 Jul. 19, 2001

(30) Foreign Application Priority Data

Jan. 17, 2000 (JP) .................................... 2000-007644

(51) Int. Cl.⁷ ............................................. B41F 15/46
(52) U.S. Cl. ..................................................... 101/123
(58) Field of Search ................................. 101/123, 124, 101/129

(56) References Cited

U.S. PATENT DOCUMENTS

| | | | | |
|---|---|---|---|---|
| 3,445,310 A | * | 5/1969 | Danielson et al. | 101/129 |
| 4,388,863 A | * | 6/1983 | De Santis | 101/129 |
| 4,854,229 A | * | 8/1989 | Vassiliou | 101/123 |
| 5,996,487 A | * | 12/1999 | Tomomatsu et al. | 101/123 |
| 6,105,495 A | * | 8/2000 | Takahashi et al. | 101/123 |

FOREIGN PATENT DOCUMENTS

| | | | | |
|---|---|---|---|---|
| JP | 59-185651 | * | 10/1984 | 101/123 |
| JP | 7-137224 | | 5/1995 | |
| JP | 2922320 | | 4/1999 | |

* cited by examiner

Primary Examiner—Stephen R. Funk  
(74) Attorney, Agent, or Firm—Oliff & Berridge, PLC

(57) ABSTRACT

A method of printing a print material on a surface of an object by placing the print material on a surface of a print mask having a plurality of holes, positioning the print mask relative to the object such that the print mask is near, and substantially parallel, to the surface of the object, moving at least one of a squeegee and a first combination of the print mask and the object relative to the other of the squeegee and the first combination, in a print direction along the surface of the print mask, while locally pressing, with the squeegee, the print mask against the surface of the object and pressing, with the squeegee, the print material along the surface of the print mask, so that a portion of the print material is printed on the surface of the object through the holes of the print mask, the method including the steps of locally pressing, with a mask-press member, the print mask against the surface of the object, at a position distant from the squeegee by a predetermined distance which assures that the mask-press member does not contact the print material being pressed by the squeegee, and moving at least one of a second combination of the squeegee and the mask-press member and the first combination of the print mask and the object relative to the other of the second combination and the first combination, in the print direction, such that the mask-press member precedes the squeegee in the print direction.

9 Claims, 6 Drawing Sheets

SCREEN PRINTING METHOD AND SCREEN PRINTING MACHINE

BACKGROUND OF THE INVENTION

1. Field of the Invention

The present invention relates to a screen printing method and a screen printing machine each of which is for printing a print material on an object through pattern holes of a print mask.

2. Discussion of Related Art

A screen printing method and a screen printing machine are widely used in various industrial fields such as an electric-circuit production industry. For example, when an electric circuit is produced, solder paste is printed on a circuit substrate (e.g., a printed wiring board, PWB) on which the electric circuit is to be assembled. After one or more electric components (ECs) are mounted on the circuit substrate, the circuit substrate is heated to melt the solder paste printed thereon and thereby electrically connect the ECs to the circuit substrate. In this field, it is practiced to form solder bumps on a circuit substrate by first printing solder paste thereon and subsequently heating and melting the printed solder paste.

There are known two major methods of printing solder paste on circuit boards. One of them is an off-contact-type screen printing method, and the other is a contact-type screen printing method. In the off-contact method, a small space is left between a print mask and a circuit substrate, and a plate-like squeegee is moved on a surface of the print mask while locally pressing the mask against the circuit substrate and moving solder paste along the surface of the mask, so that while the mask contacts the substrate, the solder paste is printed on the substrate through pattern holes of the mask. Generally, a metal mask that is formed of a metal such as copper, stainless steel, or nickel is suitable for printing of a highly viscous fluid such as solder paste. However, the metal mask is too rigid to be used in the off-contact printing. Therefore, generally, a so-called combination mask including a metallic portion and an elastically deformable mesh portion surrounding the metallic portion is used in the off-contact printing. In the off-contact printing, the print mask, except for a local portion thereof that is currently pressed by the squeegee against the circuit substrate for printing the solder paste, is kept away from the substrate, and the local portion currently pressed by the squeegee is separated, little by little, from the substrate after the squeegee has passed over the local portion. Thus, the solder paste printed on the circuit substrate is advantageously separated from the pattern holes of the print mask.

However, when the solder paste placed on the upper surface of the print mask is forced into the pattern holes of the mask by the plate-like squeegee, so as to be printed on the circuit substrate through the holes of the mask, the. solder paste may enter some holes of an adjacent portion of the mask that is adjacent to the local portion currently pressed by the squeegee against the substrate and is currently away from the substrate, and may spread on the lower surface of the mask. In this case, the solder paste may be applied to other spots on the circuit substrate than prescribed print spots thereon, or may be. adhered to the lower surface of the mask to soil the same. These phenomena do not lead to accurate printing.

In this background, currently, the contact-type screen printing method is widely used. In the contact-type method, solder paste is printed in the state in which a print mask is held in close contact with a circuit substrate. This method is particularly suitable for printing of a highly accurate and fine pattern. Either a combination mask or a metal mask may be employed as the print mask. Generally, this method needs a special technique for separating the print mask and the circuit substrate from each other after the solder paste is printed on the substrate. There are known various separating techniques.

However, in. the contact-type method, the print mask and the circuit substrate are kept in close contact with each other while the solder paste is printed on the substrate. Therefore, the solder paste may enter, because of its capillary phenomenon and/or surface tension, the interface between the mask and the substrate. Meanwhile, in the case where the circuit substrate is sucked, by vacuum, against a support surface of a substrate supporting device, air present between the mask and the substrate are sucked by the vacuum via the throughholes of the substrate, so that the solder paste may be sucked into the interface between the mask and the substrate. Moreover, the solder paste may run on the lower surface of the print mask, because of small vibrations of the substrate supporting device. These phenomena do not result in accurate printing.

It is currently practiced to clean the upper and lower surfaces of the print mask, for solving the above-described problems. There are two cleaning methods, one is a wet method in which the solder paste is solved by a solvent and then is cleaned by a cleaning paper, and the other is a dry method in which the solder paste is just cleaned by a cleaning paper. In some cases, both the wet and dry methods are employed. In either method, it is difficult to clean up the solder paste completely. The most important problem with the cleaning methods is that the cleaning of the print mask results in increasing the cycle time and accordingly lowering the production efficiency. In addition, the expensive solder paste cleaned off the print mask cannot be recycled, which is against recent tendency toward environmental pollution control. Moreover, an exclusive cleaning device is needed, which leads to increasing the running cost.

Another problem with the contact-type printing is about the separation of print mask and circuit substrate. It is not easy to separate the print mask closely contacted with the circuit substrate, from the circuit substrate, without damaging the shape of the solder paste printed thereon. The degree of ease of separation of highly viscous fluid (i.e., solder paste) from pattern holes of print mask largely depends on an aspect ratio, h/f, as a ratio of an area, h, of side surface of each pattern hole to an area, f, of print pattern of the mask. Generally, it is preferred that the aspect ratio h/f be not greater than a solder-print critical aspect ratio (h/f=0.4 to 0.5). In addition, the printability of solder is influenced by various factors including the design or composition of solder paste, the machining or material of print mask, the circuit substrate, the printing machine, and the operator. It is almost impossible to perform printing most efficiently under the best conditions of those factors. Therefore, there is a need to obtain such a special technique which can compensate for some inevitable defects of those factors. For example, a servo system is used to separate the print mask and the circuit substrate from each other by moving them over a predetermined distance at empirically obtained speeds and accelerations. However, it is impossible to move, at a certain speed or acceleration, the circuit substrate with respect to its entirety, because of the elasticity of the print mask. That is, the central portion of the circuit substrate is moved away from the print mask, faster than the end portions of the same are. It is difficult to construct a reliable multidimensional space-analysis model to control drive shafts of the servo system used to separate the print mask and the circuit substrate from each other. Thus, currently, it is difficult for the contact-type printing method to perform a sufficiently stable printing for a long time. The properties of the solder paste change day by day. Generally, the basic data of the solder paste, such as viscosity, may change by ±15% a day. Now, a huge data base including data about various variable factors is under construction in order to establish useful conditions for the separation of print mask and circuit substrate, so that the data base is utilized by a computer. However, this function is not a basic function which is properly required for the printing machine. In addition, the printing machine needs a complex device for the separation of print mask and circuit substrate, which leads to increasing the production cost thereof.

Although the above description relates to the case where solder paste is printed on circuit substrates, the same problems as identified above may occur to screen printing methods and screen printing machines which are used in other industrial fields.

SUMMARY OF THE INVENTION

The present invention provides a screen printing method and a screen printing machine which have one or more of the following technical features that are described below in respective paragraphs given parenthesized sequential numbers (1) to (10). Any technical feature that includes another technical feature shall do so by referring, at the beginning, to the parenthesized sequential number given to the latter feature. However, the following technical features and the appropriate combinations thereof are just examples to which the present invention is by no means limited. In addition, in the case where one technical feature recites a plurality of items, it is not essentially required that all of those items be simultaneously employed. That is, it is possible to select and employ only a portion (one, two, . . . , but not all) of those items.

(1) According to a first feature of the present invention, there is provided a method of printing a print material on a surface of an object by placing the print material on a surface of a print mask having a plurality of holes, positioning the print mask relative to the object such that the print mask is near, and substantially parallel, to the surface of the object, moving at least one of a squeegee and a first combination of the print mask and the object relative to the other of the squeegee and the first combination, in a print direction along the surface of the print mask, while locally pressing, with the squeegee, the print mask against the surface of the object and pressing, with the squeegee, the print material along the surface of the print mask, so that a portion of the print material is printed on the surface of the object through the holes of the print mask, the method comprising the steps of locally pressing, with a mask-press member, the print mask against the surface of the object, at a position distant from the squeegee by a predetermined distance which assures that the mask-press member does not contact the print material being pressed by the squeegee, and moving at least one of a second combination of the squeegee and the maskpress member and the first combination of the print mask and the object relative to the other of the second combination and the first combination, in the print direction, such that the maskpress member precedes the squeegee in the print direction. The term "near" means that the print mask is close to the surface of the object but is not in contact with the same, and means the presence of a distance between the mask and the object that allows the squeegee or the mask-press member to locally press the mask against the object and cause a portion of the mask to contact the object.

The present printing method is a sort of screen printing method. In the present screen printing method, the squeegee prints the print material on the object through the hole or holes ("pattern hole or holes") of a portion of the print mask that is currently pressed against the object by the mask-press member. Thus, the present printing method enjoys the aboveindicated advantages of the contact-type printing method. In addition, each portion of the print mask over which the squeegee has passed is quickly peeled off the surface ("print surface") of the object, while being somewhat inclined relative to the print surface. Thus, the print material printed on the object is easily separated from the pattern holes, and accordingly the present printing method enjoys the advantages of the off-contact printing method. That is, the present printing method enjoys the advantages of both the contact-type and off-contact-type printing methods, while avoiding the disadvantages of the same. Thus, it can perform excellent printing at low cost. Here, it is noted that it is possible to employ, in addition to the mask-press member preceding the squeegee, another mask-press member following the squeegee. In the latter case, each portion of the print mask over which the squeegee has passed is peeled off the print surface of the object, after the following mask-press member has passed over the each portion. In contrast, in the case where the following mask-press member is not employed, each portion of the print mask over which the squeegee has passed is immediately peeled off the print surface of the object.

(2) According to a second feature of the present invention that includes the first feature (1), the mask-press member comprises a press roller which rolls on the surface of the print mask.

Alternatively, the mask-press member may be a slide member which is slideable on the print mask. In the latter case, although the overall construction of the printing machine may be made simpler, a greater friction force is produced between the slide member as the mask-press member, and the print mask, which may disadvantageously lead to causing a movement of the mask out of position relative to the object. In contrast thereto, if the press roller is employed as the mask-press member according to the second feature (2), only a small friction resistance is produced between the press roller and the print mask, which minimizes the movement of the mask out of position relative to the object. Meanwhile, since the squeegee must slide on the print mask, the friction force produced between the squeegee and the mask provides some force to move to mask relative to the object. However, since the press roller presses the mask against the object, the friction force produced between the roller and the mask resists the force, exerted by the squeegee, to move the mask relative to the object. The pressing force of the press roller provides the friction force, produced between the print mask and the object, which is greater than the rolling friction force produced between the roller and the mask. Therefore, the movement of the mask out of position relative to the object is resisted by the force equal to the difference between the friction force produced between the mask and the object and the friction force produced between the mask and the roller. If this resisting force is greater than the friction force produced between the squeegee and the print mask, the mask is never moved relative to the object; and even if the resisting force is smaller than the friction force, the amount of movement of the mask relative to the object can be effectively reduced.

(3) According to a third feature of the present invention that includes the first or second feature (1) or (2), the object comprises an electric-circuit substrate and the print material comprises a solder paste.

(4) According to a fourth feature of the present invention, there is provided a printing apparatus, comprising a supporting device having a support surface which supports an object; a mask holder which holds a print mask having a plurality of holes, such that the print mask is near, and substantially parallel, to the object supported by the support surface of the supporting device; a squeegee having a press surface which locally presses the print mask held by the mask holder against the object supported by the support surface; a moving device which moves, while the squeegee locally presses the print mask against the object supported by the support surface, at least one of the squeegee and a first combination of the supporting device and the mask holder relative to the other of the squeegee and the first combination, in a print direction along the support surface, so that the squeegee presses a print material placed on a surface of the print mask, along the surface of the print mask, and forces a portion of the print material into the holes of the print mask; a mask-press member which locally presses the print mask against the object, at a position distant from the press surface of the squeegee by a first predetermined distance which assures that the mask-press member does not contact the print material being pressed by the squeegee; and a distance maintaining device which maintains, when the moving device moves, in the print direction, at least one of a second combination of the squeegee and the mask-press member and the first combination of the supporting device and the mask holder relative to the other of the second combination and the first combination, the first distance by which the mask-press member precedes the squeegee in the print direction.

The present printing apparatus is a sort of screen printing machine. The present screen printing machine can advantageously carry out the screen printing method according to the first feature (1). It is preferred that the squeegee be one which has a press surface which is inclined relative to the print mask, forward in the print direction, and which is slid on the mask while pressing the print material (e.g., solder paste) along the surface of the mask and forcing, owing to its wedge effect, the print material into the holes of the mask.

(5) According to a fifth feature of the present invention that includes the fourth feature (4), the mask-press member comprises a press roller which rolls on the surface of the print mask.

(6) According to a sixth feature of the present invention that includes the fourth or fifth feature (4) or (5), the moving device comprises a movable member which holds at least one of the squeegee and the mask-press member; and a movable-member moving device which moves the movable member in the print direction parallel to the support surface of the supporting device that supports the object.

Alternatively, the moving device may be one which moves the supporting device and the mask holder, relative to the squeegee and the mask-press member. In the latter case, however, a wide space is needed which allows the supporting device and the mask holder to be moved relative to the squeegee and the mask-press member, and which leads to increasing the overall size of the screen printing machine. In contrast thereto, the screen printing machine according to the sixth feature (6) moves the squeegee and/or the mask-press member relative to the supporting device and the mask holder, such that the squeegee and/or the press member are moved in a space provided above the supporting device and the mask holder. Thus, the size of the present machine need not be increased.

(7) According to a seventh feature of the present invention that includes the sixth feature (6), the printing apparatus further comprises an elevating and lowering device which elevates and lowers the squeegee relative to the movable member, and thereby moves the squeegee in a first direction toward, and in a second direction away from, the support surface of the supporting device.

According to an eighth feature of the present invention that includes the sixth or seventh feature (6) or (7), the printing apparatus further comprises an elevation and lowering device which elevates and lowers the mask-press member relative to the movable member, and thereby moves the mask-press member in a first direction toward, and in a second direction away from, the support surface of the supporting device.

In the case where the squeegee and the mask-press member are supported by a single elevator member, the squeegee and the mask-press member may be elevated and lowered by a common elevating and lowering device. Otherwise, the squeegee and the mask-press member may be elevated and lowered by respective exclusive elevating and lowering devices, independent of each other. The latter manner is more useful than the former manner. For example, the print material which has been moved by the squeegee to one of opposite ends of the print mask in the print direction can be easily returned to the other end of the mask, irrespective of whether printing is effected during the returning of the print material. In addition, the respective contact forces exerted to the print mask by the squeegee and the mask-press member can be adjusted or controlled, independent of. each other.

(9) According to a ninth feature of the present invention that includes any one of the fourth to eighth features (4) to (8), the printing apparatus further comprises a following press member which is different from the mask-press member as a preceding press member, which is distant from the squeegee by a second predetermined distance in a direction opposite to the print direction, and which locally presses the print mask against the object supported by the support surface, the first combination comprising the following press member in addition to the squeegee and the preceding press member.

Since the present screen printing machine includes both the preceding and following press members, the squeegee has only to print the print material at the central portion of a portion of the print mask that is currently pressed by the two press members. Thus, the present machine can perform a more stable printing. For example, in the case where only the preceding press member is employed, the squeegee is required to not only force the print material into the holes of the print mask but also press the mask against the object. In the latter case, therefore, if a suitable contact force, exerted by the squeegee to the print mask, for forcing the print material into the pattern holes is smaller than a suitable force for pressing the mask against the object, the former contact force must be sacrificed. In contrast thereto, the screen printing machine according to the ninth feature (9) is free of this problem. Meanwhile, if both of the preceding and following press rollers are provided by press rollers, a greater friction force is produced between the print mask and the object, which contributes to preventing the mask from being moved out of position relative to the object.

(10) According to a tenth feature of the present invention that includes any one of the fourth to ninth features (4) to (9), the supporting device comprises a substrate supporting device which supports an electric-circuit substrate as the object, and the squeegee prints a solder paste as the printing material, on the electric-circuit substrate supported by the substrate supporting device.

BRIEF DESCRIPTION OF THE DRAWINGS

The above and optional objects, features, and advantages of the present invention will be better understood by reading the following detailed description of preferred embodiments of the invention when considered in conjunction with the accompanying drawings, in which.

DETAILED DESCRIPTION OF PREFERRED EMBODIMENTS

Hereinafter, there will be described in detail a screen printing machine to which the present invention is applied, by reference to the drawings. The screen printing machine prints a solder paste as a print material, on a printed wiring board (PWB) as a sort of circuit substrate as an object.

Figure 1:
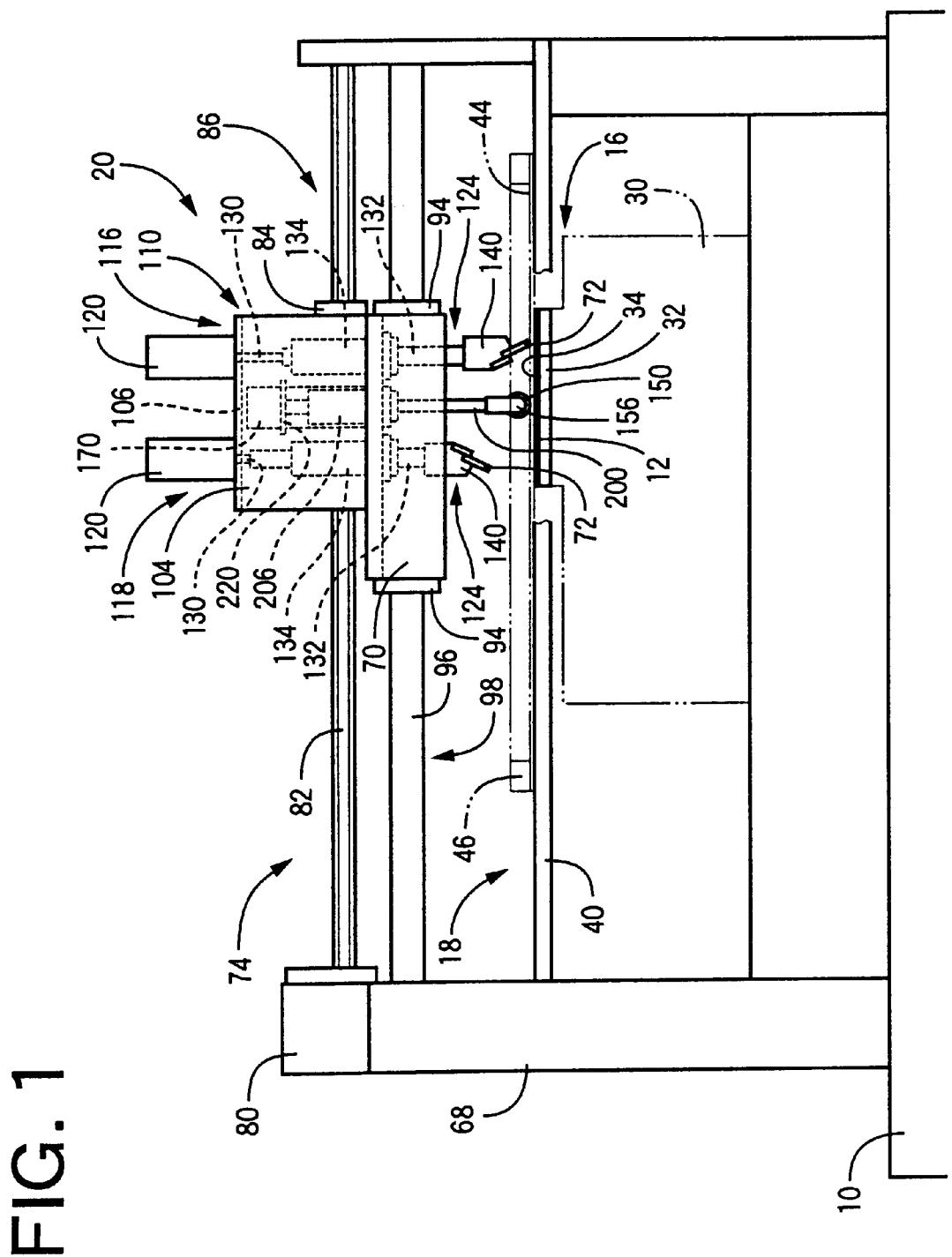
FIG. 1 is a front elevation view of a screen printing machine which embodies the present invention and which is suitable for carrying out a screen printing method which also embodies the present invention.

In FIG. 1, reference numeral 10 designates a base of the screen printing machine. On the base 10, there are provided a PWB conveyor (not shown) which conveys a PWB 12 in a horizontal, PWB-convey direction (i.e., a leftward or a rightward direction as seen in FIG. 1; hereinafter, referred as the X-axis direction); a PWB positioning and supporting device 16, a mask positioning and supporting device 18, and a squeegee device 20.

The PWB positioning and supporting device 16 includes an elevating and lowering device 30, and a PWB-support table 32 which is elevated and lowered by the elevating and lowering device 30. The elevating and lowering device 30 may be provided by a pressurized-fluid-operated (e.g., pressurized-air-operated) cylinder device. The PWB 12 is conveyed by the PWB conveyor, subsequently is stopped by a PWB stopping device, and then is positioned, by a positioning device such as one or more positioning pins, on a support surface 34 of the PWB-support table 32. The PWB-support table 32 cooperates with PWB hold-down plates (not shown) provided above the table 32 to sandwich the PWB 12, and attracts the PWB 12 by applying vacuum thereto. In this state, the PWB-support table 32 is elevated by the elevating and lowering device 30, to a print position where a solder paste is printed on the PWB 12 supported by the table 32. Thus, the elevating and lowering device 30 provides a moving device which moves a print surface 36 (FIG. 2) of the PWB 12 that is opposite to a back surface thereof supported by the PWB-support table 32, toward, and away from, a print mask 44, described later.

The mask positioning and supporting device 18 includes a mask-support table 40 which supports the print mask 44 and a mask-hold frame 46 fixed to the periphery of the print mask 44. The mask-support table 40 is a rectangular framework, on which the mask-hold frame 46 is provided. The mask-hold frame 46 is positioned in the X-axis direction and a Y-axis direction perpendicular to the X-axis direction on a horizontal plane, by an X-axis-direction positioning device and a Y-axis direction positioning device (not shown), and is fixed to the mask-support table 40 by a fixing device (not shown).

Figure 2:
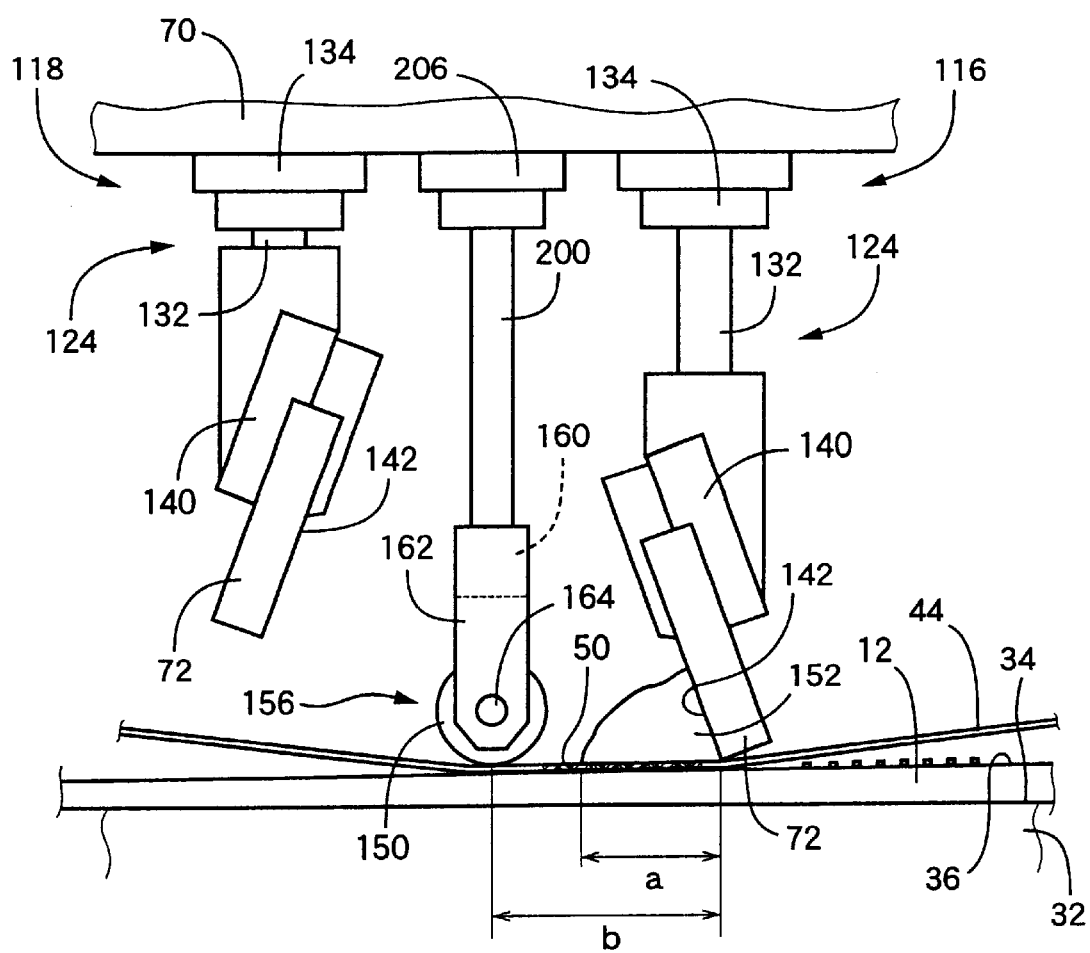
FIG. 2 is a front elevation view of squeegees and a mask-press member as elements of the screen printing machine.

The print mask 44 is a so-called combination mask including a metallic portion which is formed of a metal such as copper, stainless steel, or a nickel, and an elastically deformable mesh portion which surrounds the metallic portion. As shown in FIG. 2, the print mask 44 has a plurality of pattern holes 50 in the form of through-holes formed through the thickness thereof 44, at respective positions corresponding to respective print positions on the print surface 36 of the PWB 12. Thus, each of the pattern holes 50 opens in both an upper and a lower surface of the print mask 44, and the solder paste is printed on the PWB 12 through each of the pattern holes 50. The print mask 44 has the pattern holes 50 at respective positions corresponding to respective positions on the PWB 12 where lead wires of a flat-package-type electric component are bonded, and respective electrodes of a resistor and a capacitor are bonded, to the PWB 12.

As shown in FIG. 1, on the base 10, there is also provided a frame 68 which supports the squeegee device 20. The squeegee device 20 includes a slide member 70; two squeegees 72 each of which is supported by the slide member 70 such that the each squeegee 72 is movable upward and downward; and a slide moving device 74 which moves the slide member 70 in the X-axis direction. The slide moving device 74 includes a servomotor 80 as a drive source; and a motion converting device 86 which includes a ball screw 82 as a sort of feed screw, and a nut 84 and which converts the rotation of the servomotor 80 into the linear movement of the slide member 70 in the X-axis direction. The movement of the slide member 70 is guided by a guide device 98 including two guide blocks 94 as guided members that are provided on opposite side surfaces of the slide member 70, respectively, and a guide rail 96 as a guide member that is supported by the frame 68. The servomotor 80 is an electric rotary motor as a sort of drive source and is accurately controllable with respect to its rotation angle and speed. The servomotor 80 may be replaced with a stopper motor.

A gate-like frame 110 is fixed to the slide member 70. The frame 110 includes a pair of side walls 104 (only one side wall 104 is shown in FIG. 1), and a top wall 106. The slide member 70 and the frame 110 cooperate with each other to hold a first and a second squeegee unit 116, 118 which are moved by the slide moving device 74. In the present embodiment, the X-axis direction is a squeegee-move direction, i.e., a screen-print direction. The two squeegee units 116, 118 are symmetrical with each other with respect to a plane perpendicular to the print mask 44 and the squeegee-move direction, but have the same structure. Therefore, the first squeegee unit 116 will be described below as a representative of the two units 116, 118.

The first squeegee unit 116 includes an elevator portion 124 which is moved upward and downward by a pair of squeegee elevating and lowering air-cylinder devices 120

(only one air-cylinder device 120 is shown in FIG. 1) each as a squeegee elevating and lowering device. When the elevator portion 124 is moved up and down, the squeegee 72 is moved toward, and away from, the support surface 34 of the PWB-support table 32. Each of the air-cylinder devices 120 is a sort of pressurized-fluid-operated cylinder device, and a sort of pressurized-fluid-operated actuator as a drive source. The two air cylinders 120 are fixed to the top wall 106 of the gate-like frame 110 such that the two air cylinders 120 are oriented downward and are distant from each other in the Y-axis direction. Respective piston rods 130 of the two cylinder devices 120 extend through the thickness of the top wall 106, and respective guide rods 132 fixed to respective lower ends of the two piston rods 130 are fitted in two guide sleeves 134 fixed to the slide member 70 such that the two guide rods 132 are slideable relative to the two guide sleeves 134, respectively, in respective axial directions of the rods 132 (or the sleeves 134). The upward and downward movements of the squeegee 72 are guided by a guide device including the guide rods 132 each as a guided member and the guide sleeves 134 each as a guide member.

A squeegee holder 140 as a squeegee holding member or device is connected to respective lower ends of the two guide rods 132, such that the squeegee holder 140 is pivotable by a small angle in a vertical plane including the guide rods 132. The squeegee holder 140 has an elongate shape, and extends parallel to the Y-axis direction perpendicular to the squeegeemove direction. The squeegee 72 is detachably attached to the squeegee holder 140. The squeegee 72 is provided by a plate-like rubber member, and is held by the squeegee holder 140 such that the squeegee 72 extends in the Y-axis direction perpendicular to the squeegee-move direction. More specifically described, the squeegee 72 is held by the squeegee holder 140 such that the squeegee 72 is forward inclined relative to a plane perpendicular to the print mask 44 and the squeegee-move direction. That is, a press surface 142 of the squeegee 72 that is for pressing a solder paste 152 (FIG. 2) has an acute angle with respect to the print mask 44. The first squeegee unit 116 is provided with a load detecting device (not shown) which detects a load which is applied by the squeegee 72 to the print mask 44 when the squeegee 72 contacts the mask 44, and a control device (not shown) which controls, based on the detected load, the load applied by the squeegee 72 to the print mask 44, by adjusting the pressure of the pressurized air supplied to each of the two air cylinders 120. The load detecting device may include two load cells which are provided at two locations corresponding to the two air cylinders 120. Thus, the squeegee 72 is contacted with the print mask 44 with an appropriate load. Since the structure of the elevator portion 124 including the squeegee holder 140 is not relevant to the present invention and is well known in the art, no detailed description or illustration thereof is provided here.

As shown in FIG. 2, the slide member 70 supports a press roller 150 as a mask-press member, at a position intermediate between, and equidistant from, the two squeegee units 116, 118 in the squeegee-move (i.e., X-axis) direction. The slide member 70 supports, like each of the two squeegees 72, the press roller 150 such that the press roller 150 is movable up and down. When the slide member 70 is moved in the leftward direction as seen in FIG. 2, the squeegee 72 of the left-hand squeegee unit 118 is held at its upper position away from the print mask 44, and the solder paste 152 placed on the upper surface of the print mask 44 is pressed by the squeegee 72 of the right-hand squeegee unit 116. When the squeegee 72 is moved on the print mask 44, the press roller 150 precedes the squeegee 72 in such a manner that a distance, b, between a position where the press surface 142 of the squeegee 72 contacts the print mask 44 and a position where the press roller 150 contacts the mask 44, in the X-axis direction, is greater than a dimension, a, of the solder paste 152 as measured in the X-axis direction. Thus, during each printing operation, the distance b which assures that the press roller 150 does not contact the solder paste 152 is maintained.

Figure 3:
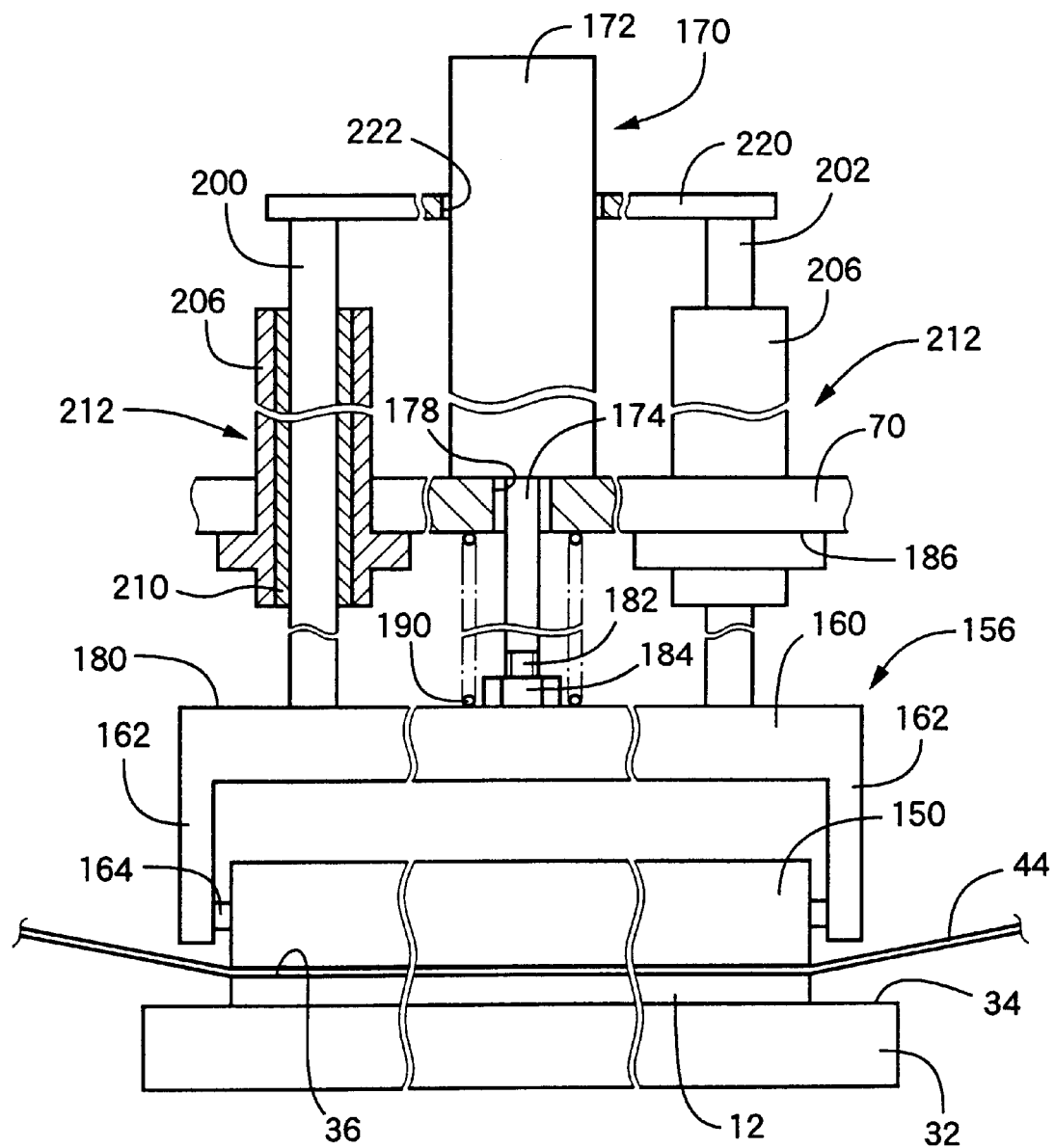
FIG. 3 is a partly cross-sectioned, side elevation view of the mask-press member.

As shown in FIG. 3, the press roller 150 is attached to a support arm 156 as a support member, such that the press roller 150 is rotatable about a horizontal axis line extending in a widthwise direction of the print mask 44, i.e., the Y-axis direction. The support arm 156 has a generally inverted-U-shaped configuration, and includes a top wall 160 extending in the Y-axis direction perpendicular to the squeegee-move direction, and a pair of side walls 162 extending downward from opposite ends of the top wall 160 that are distance from each other in the Y-axis. direction. The two side walls 162 support opposite end portions of a rotatable shaft 164 to which the press roller 150 is fixed, such that the rotatable shaft 164 is rotatable and is not movable in an axial direction thereof. It is preferred that the press roller 150 be formed of a soft material such as sponge or urethane and have a width equal to, or somewhat greater than, the width of the PWB 12 supported by the PWB supporting and positioning device 16.

As shown in FIG. 3, the slide member 70 supports a press-roller elevating and lowering air cylinder 170 as a press-member elevating and lowering device, such that the air cylinder 170 is oriented downward. The air cylinder 170 is a sort of fluid-pressure-operated cylinder device, and a sort of fluid-pressure-operated actuator as a drive source. A cylinder housing 172 of the air cylinder 170 is fixed to the slide member 70, and a piston rod 174 projects downward from the cylinder housing 172 through a through-hole 178 formed through the thickness of the slide member 70. A lower end of the piston rod 174 is fixed by an appropriate fixing device to an upper surface 180 of the top wall 160 of the support arm 156. In the present embodiment, the fixing device includes an externally threaded portion 182 formed on the lower end portion of the piston rod 174, an internally threaded hole (not shown) formed in the upper surface 180 of the top wall 160 of the support arm 156 and threadedly engaged with the externally threaded portion 182, and a nut 184 fastened on the externally threaded portion 182 against the top wall 160. When the piston rod 174 is extended out of the housing 172 and retracted into the same 172, the press roller 150 is moved down and up, and thereby moved toward, and away from, the support surface 34 of the PWB-support table 32.

A compression coil spring 190 as an elastic member as a sort of biasing device is provided between a lower surface 186 of the slide member 70 and the upper surface 180 of the support arm 156, and biases, via the support arm 156, the press roller 150 in a direction toward the support surface 134 of the support table 32. The pressing force of the press roller 150 can be easily adjusted by changing the pressure of the pressurized air supplied to the air cylinder 170. More specifically described, the biasing force of the spring 190 can be reduced by supplying the pressurized air to a lower chamber of the air cylinder 170, communicating an upper chamber of the same 170 with the atmosphere, and thereby producing a force to retract the piston rod 174 into the housing 172. Thus, the pressing force of the press roller 150 can be changed, by controlling the air pressure supplied to the lower chamber, to an appropriate value smaller than the sum of the elastic force of the spring 190 and the total weight of the press roller 150, the support arm 156, etc. Alternatively, it is possible to change, by communicating the lower chamber with the atmosphere and controlling the air pressure supplied to the upper chamber, the pressing force of the press roller 150 to an appropriate value greater than the sum of the elastic force of the spring 190 and the total weight of the press roller 150, the support arm 156, etc.

Two straight guide rods 200, 202 each as a guided member are fixed to the upper surface 180 of the support arm 156, at respective positions distant from each other in the Y-axis direction, such that the guide rods 202, 202 vertically extend. Meanwhile, two guide sleeves 206 each as a guide member are fixed to the slide member 70 such that the guide sleeves 206 vertically extend. The two guide rods 200, 202 are fitted in the two guide sleeves 206 via respective bearings 210, such that the guide rods 200, 202 are slideable relative to the guide sleeves 206 in respective axial directions thereof. The upward and downward movements of the press roller 150 are guided by a guide device 212 including the guide rods 200, 202 and the guide sleeves 206. Respective upper ends of the two guide rods 200, 202 are connected to each other by a plate-like connection member 220 extending in the Y-axis direction. Thus, the two guide rods 200, 202 are moved up and down as a unit. The connection member 220 has, at a position corresponding to the air cylinder 170, a through-hole 222 through which the air cylinder 170 extends, so that the connection member 220 can be moved up and down relative to the air cylinder 170 without being interfered with by the same 170.

Next, there will be described the operation of the screen printing machine constructed as described above. The present screen printing machine performs off-contact-type screen printing in which printing is effected in the state in which the print mask 44 is kept away from the PWB 12 by a small distance. When the solder paste 152 is printed on the PWB 12, first, the print mask 44 is positioned and fixed on the mask-support table 40, and the solder paste 152 kneaded to an appropriate viscosity is placed on the upper surface of the print mask 44. Meanwhile, the slide member 70 of the squeegee device 20 is positioned, in the X-axis direction, at a position right above one of opposite ends of a prescribed print area of the print mask 44, while the first and second squeegee units 116, 118 and the press roller 150 are all kept at their upper positions away from the print mask 44.

Then, the PWB 12 is conveyed by the board conveyor (not shown), and is positioned and fixed on the support surface 34 of the PWB-support table 32. In this state, the PWB 12 is elevated by the elevating and lowering device 30, to a position in close proximity to the print mask 44, such that the print surface 36 of the PWB 12 is substantially parallel to a lower surface of the print mask 44. Subsequently, as shown in FIG. 2, the squeegee 72 of one of the two squeegee units 116, 118 (i.e., the first squeegee unit 116 in the embodiment shown in FIG. 2) is lowered to contact locally the upper surface of the print mask 44 and thereby press the mask 44 against the PWB 12. Concurrently the press roller 150 is lowered to contact locally the upper surface of the mask 44, such that the roller 150 precedes the squeegee 72 by the predetermined distance which assures that the roller 150 does not contact the solder paste 152 placed on the mask 44. The press roller 150 locally presses the mask 44 against the PWB 12.

When the first squeegee unit 116 is used for printing, the pressurized air is supplied to the respective upper chambers of the two air cylinders 120 of the first unit 116, and the respective lower chambers of the air cylinders 120 are communicated with the atmosphere, so that the squeegee 72 is lowered to contact locally the print mask 44. The squeegee 72 can be contacted with the print mask 44 with a desirable contact force by adjusting each of the respective air pressures supplied to the two air cylinders 120 that are distant from each other in a lengthwise direction of the squeegee 72. It is preferred that the contact force of the press roller 150 be substantially equal to, or somewhat greater than, the contact force of the squeegee 72, for the purpose of preventing the print mask 44 from being moved out of position relative to the PWB 12 during printing. Therefore, if the contact force of the press roller 150 is too much greater than that of the squeegee 72, the pressurized air is supplied to the lower chamber of the air cylinder 170, and the upper chamber of the same 170 is communicated with the atmosphere, so that the biasing force of the compression coil spring 190 is reduced to provide an appropriate pressing force.

Thus, in the state in which the squeegee 72 and the press roller 150 press portions of the print mask 44 against the PWB 12, the slide moving device 74 moves the slide member 70 in the X-axis direction. Consequently the squeegee 72 which is inclined forward in the screen-print direction slides on the upper surface of the print mask 44, while pressing the solder paste 152 along the upper surface of the mask 44. Owing to the "wedge" effect of the squeegee 72, the solder paste 152 is forced into the pattern holes 50 of the mask 44, so that the solder 152 is printed on the PWB 12 through the holes 50. In addition, the press roller 150 rolls on the upper surface of the print mask 44, while the predetermined distance between the roller 150 and the squeegee 72 is maintained. Here it is noted that FIGS. 2 and 3 show an exaggerated space between the print mask 44 and the PWB 12, and accordingly an exaggerated angle of inclination of a portion of the print mask 44 that is between a portion thereof pressed by the roller 150 and a portion thereof held by the holder frame 46.

Thus, the slide member 70 is moved from one end of the print area to the other end thereof, and the solder paste 152 is printed on one PWB 12. Then, the squeegee 72 and the press roller 150 of the first squeegee unit 116 are moved upward, and the one PWB 12 is carried out. After another PWB 12 is positioned at the position in close proximity to the print mask 44, the slide member 70 is moved so that the squeegee 72 of the second squeegee unit 118 and the press roller 150 are located on both sides of the solder paste 152 on the mask 44, and then the squeegee 72 and the press roller 150 are moved downward. Thus, printing is effected with a portion of the print mask 44 being pressed on the PWB 12. In this case, too, the press roller 150 precedes, by the distance b, the squeegee 72 of the second squeegee unit 118. Since the contact force applied by the second squeegee unit 118 to the print mask 44 and the press. force applied by the press roller 150 to the mask 44 are adjusted in the same manners as those described above for the first squeegee unit 116 and the press roller 150, no description thereof is provided.

As is apparent from the foregoing description, the PWB positioning and supporting device 16 provides a supporting device which supports the PWB as an object; and the mask positioning and supporting device 18 provides a mask holding device or a mask holder. The slide member 70 as a movable member and the slide moving device 74 as a movable-member moving device cooperate with each other to provide a moving device which moves at least one of the squeegee 72 and a combination of the supporting device and the mask holder, relative to the other of the squeegee 72 and the combination. The slide member 70 provides a distance maintaining device which supports the squeegee 72 and the press roller 150 such that the print-direction distance between the two elements 72, 150 is maintained during printing.

In the present embodiment, a portion of the print mask 44 that corresponds to the distance between the squeegee 72 pressing and printing the solder paste 152, and the press roller 150 preceding the squeegee 72, are closely contacted with the print surface 26 of the PWB 12. Accordingly the solder paste 152 is effectively prevented from moving from the upper surface of the mask 44 to the lower surface thereof through the pattern holes 50. Thus, the screen printing can be performed with high accuracy and stability. In addition, a portion of the print mask 44 over which the squeegee 72 has just moved in printing is automatically and immediately peeled off the print surface 36 of the PWB 12, because of the tensile force of the mask 44. Thus, the solder paste 152 is effectively prevented from spreading on the lower surface of the mask 44. Moreover, since the solder paste printed on the print surface 36 is well separated from the pattern holes 50, the printed solder-paste spots enjoy very accurate shapes. That is, the present screen printing machine enjoys both the advantage of the conventional contact-type printing method that the print mask 44 is pressed against the PWB 12 by the squeegee 72 and the press roller 150, and the advantage of the conventional off-contact-type printing method that each portion of the print mask 44 over which the squeegee 72 has just passed is immediately peeled off the PWB 12. Thus, the present machine can perform the screen printing with high accuracy and low cost. Moreover, the present machine does not need any of such special techniques to separate the print mask 44 and the PWB 12 from each other, as previously identified in Discussion of Related Art, and can easily perform printing at low cost. Furthermore, the present machine can reduce the frequency of use of a cleaning device which cleans the print mask 44, or may not need the cleaning device. Thus, the present machine can perform printing with high efficiency and at low cost.

The press roller 150 rolls on the upper surface of the print mask 44. Therefore, the friction force produced between the roller 150 and the mask 44 is considerably small, which contributes to preventing the mask 44 from being moved out of position relative to the PWB 12. In addition, the pressing force of the press roller 150 applied to. the print mask 44 increases the friction force produced between the mask 44 and the PWB 12, which contributes to preventing the mask 44 from being moved out of position relative to the PWB 12 because of the friction force produced between the squeegee 72 and the mask 44. Moreover, the press roller 150 is supported by the slide member 70 such that the distance which assures that the roller 150 does not contact the solder paste 152 is maintained between the squeegee 72 and the roller 150. Thus, the press roller 150 allows the squeegee 72 to press the solder paste 152 and print the same 152 on the PWB 12. Furthermore, since each of the squeegees 72 and the press roller 150 are moved up and down, independently of each other, by the respective exclusive air cylinders 120, 170, the present screen printing machine can be easily used.

Figure 4:
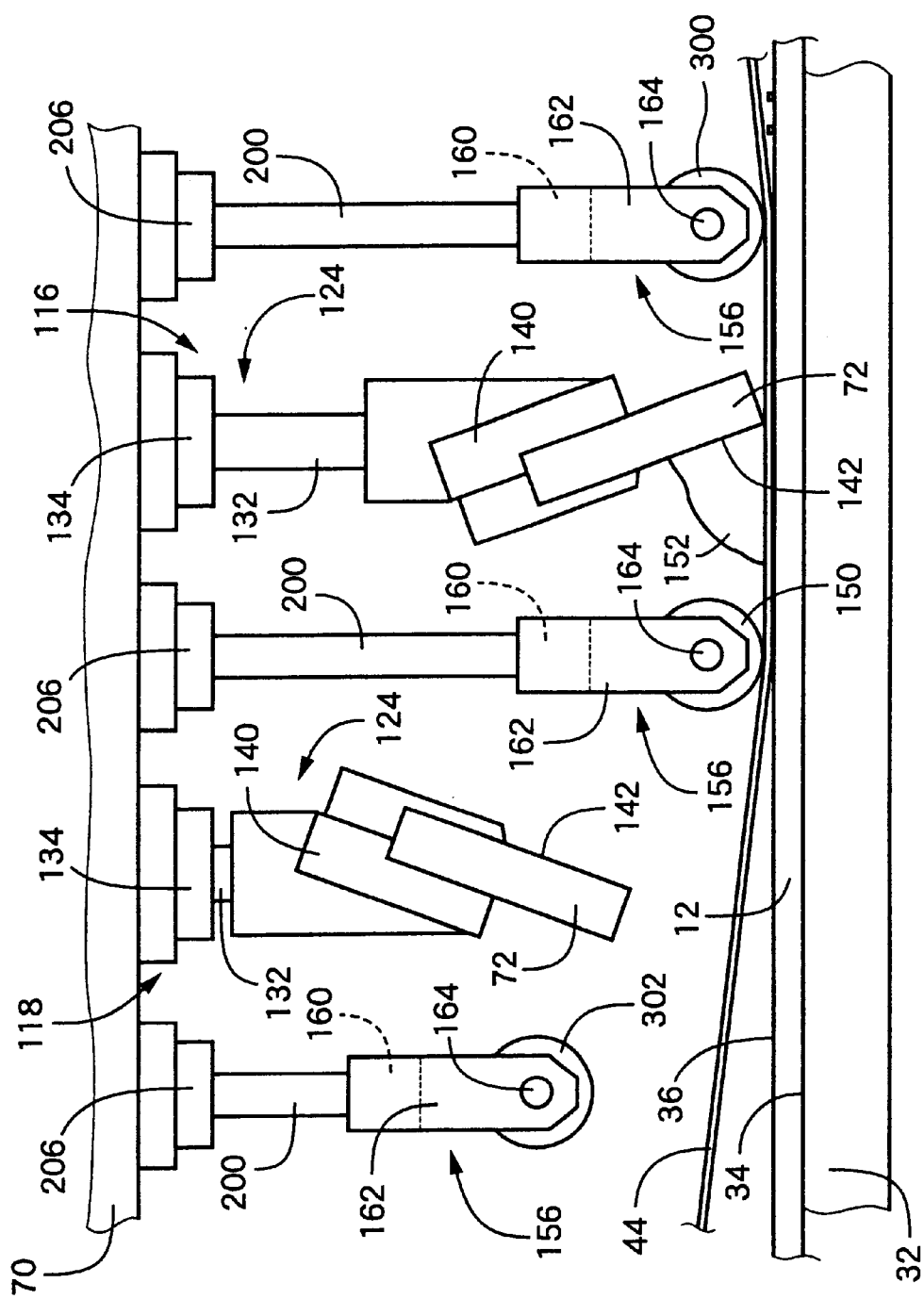
FIG. 4 is a front elevation view of squeegees and mask-press members of another screen printing machine as a second embodiment of the present invention.

FIG. 4 shows a second embodiment of the present invention that differs from the first screen printing machine, shown in FIGS. 1 to 3, only in that the present, second screen printing machine additionally includes two press rollers 300, 302 which are provided outside the two squeegee units 116, 118, respectively, in the X-axis direction, as seen from the central press roller 150. Thus, the central press roller 150 precedes each of the first and second squeegee units 116, 118 in a corresponding screen-print direction, like in the first embodiment shown in FIGS. 1 to 3, and additionally the first outside press roller 300 follows the first squeegee unit 116 in its screen-print direction (i.e., the leftward direction as seen in. FIG. 4); and the second outside press roller 302 follows the second squeegee unit 118 in its screen-print direction (i.e., the rightward direction in FIG. 4). The two outside press rollers 300, 302 are spaced, in the X-axis direction, away from the corresponding squeegee units 116, 118 by respective predetermined distances, but it is preferred that the press rollers 300, 302 are provided near to the corresponding squeegee units 116, 118. The two press rollers 300, 302 have the same structure as that of the press roller 150, and is supported by the slide member 70 such that each of the rollers 300, 302 is movable up and down. Therefore, the same reference numerals as used in the first embodiment are used to designate the corresponding elements and parts of the press rollers 300, 302, and the description thereof is omitted. In addition, the other portions of the second screen printing machine than the press rollers 300, 302 are the same as those of the first screen printing machine shown in FIGS. 1 to 3. Accordingly, the same reference numerals as used in the first embodiment are used to designate the corresponding elements and parts of the second embodiment, and the description thereof is omitted. The following description relates to only the differences between the first and second embodiments.

When the second screen printing machine shown in FIG. 4 is operated to perform screen printing, first, a solder paste 152 kneaded to an appropriate viscosity is placed on an upper surface of a print mask 44 which is positioned and fixed like in the first embodiment, and then a PWB 12 is positioned relative to the print mask 44 such that a print surface 36 of the PWB 12 is substantially parallel, and in close proximity, to a lower surface of the mask 44. In this state, if a first squeegee unit 116 is used, then the central press roller 150 and the first outside 300 are lowered to press locally the print mask 44 against the PWB 12, and concurrently a squeegee 72 of the first unit 116 is lowered to contact the mask 44. In this state, a squeegee 72 of the second squeegee unit 118 and the second outside press roller 302 are held at their upper positions away from the mask 44.

Then, a slide member 70 is moved in the screenprint direction, i.e., the X-axis direction (i.e., the leftward direction as seen in FIG. 4), and the solder paste 152 is printed on one PWB 12 in the previously-described manner. Subsequently, the squeegee 72 of the first squeegee unit 116 and the press rollers 150, 300 are elevated to their upper positions, and the one PWB 12 is discharged from a PWB positioning and supporting device 16 or a PWB-support table 32. Then, another PWB 12 is positioned in close proximity to the print mask 44, and the slide member 70 is moved to position the squeegee 72 of the second squeegee unit 118 and the central press roller 150, on both sides of the solder paste 152 placed on the print mask 44, respectively. Next, the press rollers 150, 302 are lowered to press locally the print mask 44 against the second PWB 12, and the squeegee 72 of the second squeegee unit 118 is lowered to contact the mask 44 and print the solder 152 on the second PWB 12. During the printing operation, the first squeegee unit 116 and the press roller 150 are held at their upper positions away from the print mask 44. It is preferred that when the first squeegee unit 116 is used, the respective press forces of the two press rollers 150, 300 before and after the squeegee 72 thereof be equal to each other, and that when the second squeegee unit 118 is used, the respective press forces of the two press rollers 150, 302 before and after the squeegee 72 thereof be equal to each other. However, this is not essentially required. That is, the respective press forces of the two press rollers 150, 300 before and after the squeegee 72 of the first squeegee unit 116, or the respective press forces of the two press rollers 150, 302 before and after the squeegee 72 of the second squeegee unit 118 may not be equal to each other depending upon given conditions.

In the second embedment shown in FIG. 4, the press roller 150 functions as the preceding press member for each of the two squeegee units 116, 118; and the two press rollers 300, 302 function as the respective following press members for the two squeegee units 116, 118. Thus, a portion of the print mask 44 that is currently pressed by each one of the two squeegees 72 for printing the solder paste 152, and its preceding and following portions are held in contact with the PWB 12. Thus, the present screen printing machine can perform screen printing with accuracy and stability. Since the press rollers 150, 300, 302 have the role of pressing the print mask 44 against the PWB 12, the contact force of each squeegee 72 applied to the print mask 44 has only to be controlled to a value suitable for forcing the solder paste 152 into the pattern holes 50 of the mask 44. Therefore, particularly in the case where the contact force of the squeegee 72 suitable for printing the solder paste 152 is smaller than that suitable for pressing the mask 44 against the PWB 12, the pressing force applied to the squeegee 72 can be easily adjusted depending upon the sort of the solder paste 152 used and the sort of the print mask 44 used. In addition, in this case, each squeegee 72 is less influenced by the roughness of the print surface 36 of the PWB 12 and/or the upper surface of the print mask 44. Thus, the present printing machine can perform a highly accurate screen printing. For example, a print mask which is produced by half-etching method or additive method has an uneven thickness, and accordingly the contact force of the squeegee may not be uniform over the entire length thereof. Particularly in the case where the thickness of the print mask changes in its widthwise direction, it is difficult to hold the entirety of the squeegee in close contact with the surface of the print mask. In contrast, in the screen printing machine shown in FIG. 4, since the press rollers 150, 300, 302 press the print mask 44 against the PWB12, each squeegee 72 may be formed of such a material which is selected while taking into account only whether it is suitable for printing. For example, each squeegee 72 may be formed of an elastically deformable material, such as urethane rubber, so that the entire squeegee 72 can be held in close contact with the print mask 44 whose thickness is uneven. Meanwhile, the respective air cylinders 120 of the two squeegee units 116, 118 can adjust, as described above, their pressing forces applied to each squeegee 72 at the two positions distant from each other in the widthwise direction of the mask 44. Thus, the entire squeegee 72 can be more advantageously held in close contact with the print mask 44 whose surface is uneven.

In the screen printing machine shown in FIG. 4, the central press roller 150 may be omitted in a modified embodiment. In this case, the first and second outer press rollers 300, 302 provide the preceding and following press rollers for the second squeegee unit 118, respectively, and provide the following and preceding press rollers for the first squeegee unit 116, respectively. In addition, in this case, the distance between the first and second squeegee units 116, 118 in the X-axis direction can be reduced as compared with the second embodiment in which the central pressing roller 150 is employed. In this modified form, too, a predetermined distance between a first position where the first outer press roller 300 as the preceding press roller of the second squeegee unit 118, or the second outer press roller 302 as the preceding press roller of the first squeegee unit 116, contacts the print mask 44 and a second position where the squeegee 72 of the second squeegee unit 118, or the squeegee 72 of the first squeegee unit 116 contacts the mask 44, in the X-axis direction, is greater, like in the first embodiment shown in FIG. 1–3 or the second embodiment shown in FIG. 4, than an X-axis-direction dimension of the solder paste 152 which is placed on the mask 44 and is pressed by the press surface 142 of each squeegee 72. During the printing, this predetermined distance is maintained, and accordingly the press rollers 300, 302 do not contact the solder paste 152.

Figure 5:
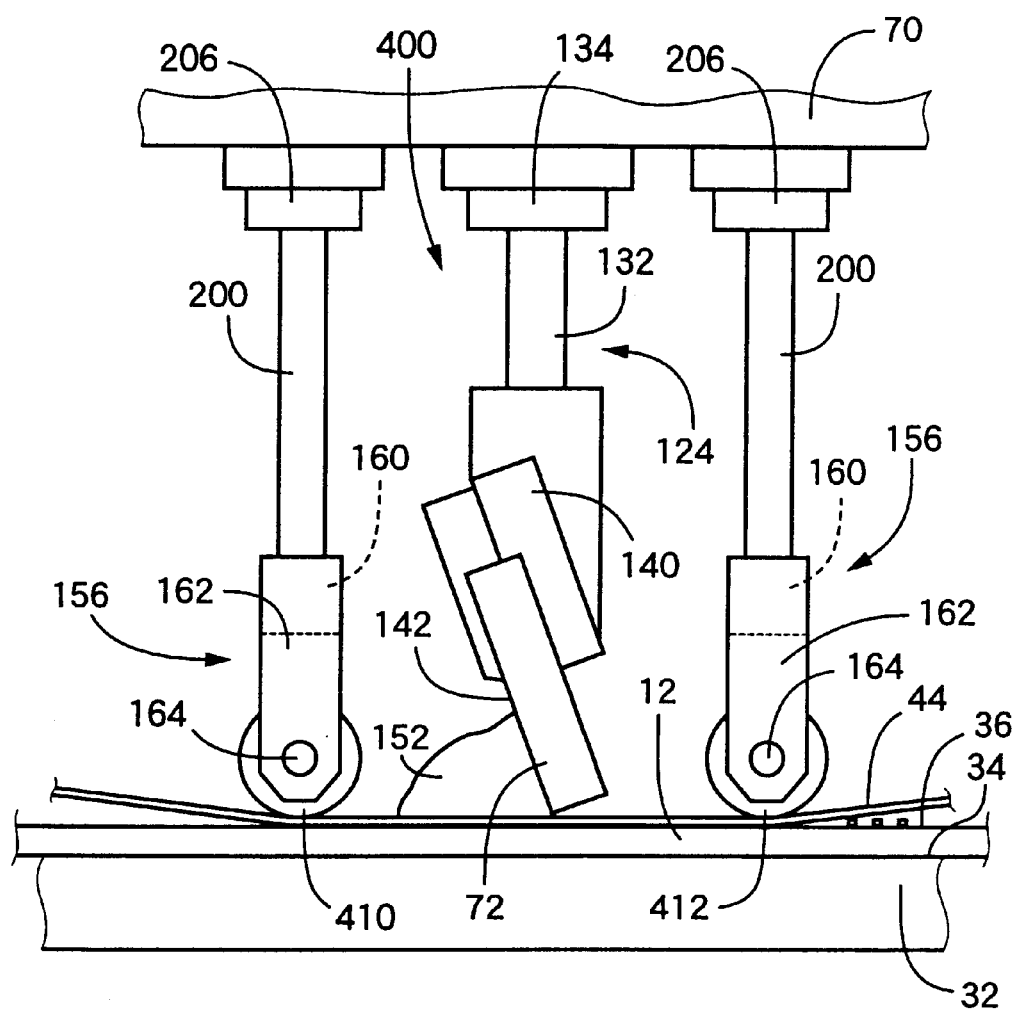
FIG. 5 is a front elevation view of a squeegee and mask-press members of yet another screen printing machine as a third embodiment of the present invention.

FIG. 5 shows a third embodiment of the present invention that relates to a screen printing machine which has only one squeegee unit 400. Since a basic construction of the present printing machine is the same as that of the printing machine shown in FIGS. 1 to 3, the same reference numerals as used in the first embodiment shown in FIGS. 1 to 3 are used to designate the corresponding elements and parts of the third embodiment, and the description thereof is omitted. The following description relates to only the differences between the first and third embodiments.

As shown in FIG. 5, on a downstream side of the squeegee unit 400 including a squeegee 72 in a screen-print direction (i.e., a leftward direction as seen in FIG. 5), there is provided a first press roller 410 as a preceding press member; and on an upstream side of the squeegee unit 400 as seen in the screen-print direction, there is provided a second press roller 412 as a following press member. Like in each of the first and second embodiments, the first press roller 410 is provided at a position distant from a press surface 142 of the squeegee 72 by a predetermined distance which assures that the first pressure roller 410 does not contact a solder paste 152 which is placed on a print mask 44 and is pressed by the press surface 142. The squeegee unit 400 and the two press rollers 410, 412 are supported by a slide member 70 such that each of the elements 400, 410, 412 is movable up and down. The squeegee unit 400 has the same construction as that of the first and second squeegee units 116, 118 employed in the first embodiment, and the two press rollers 410, 412 have the same construction as that of the press roller 150 employed in the first embodiment. Therefore, the same reference numerals as used in the first embodiment shown in FIGS. 1 to 3 are used to designate the corresponding elements and parts of the elements 400, 410, 412, and the description thereof is omitted.

Figure 6:
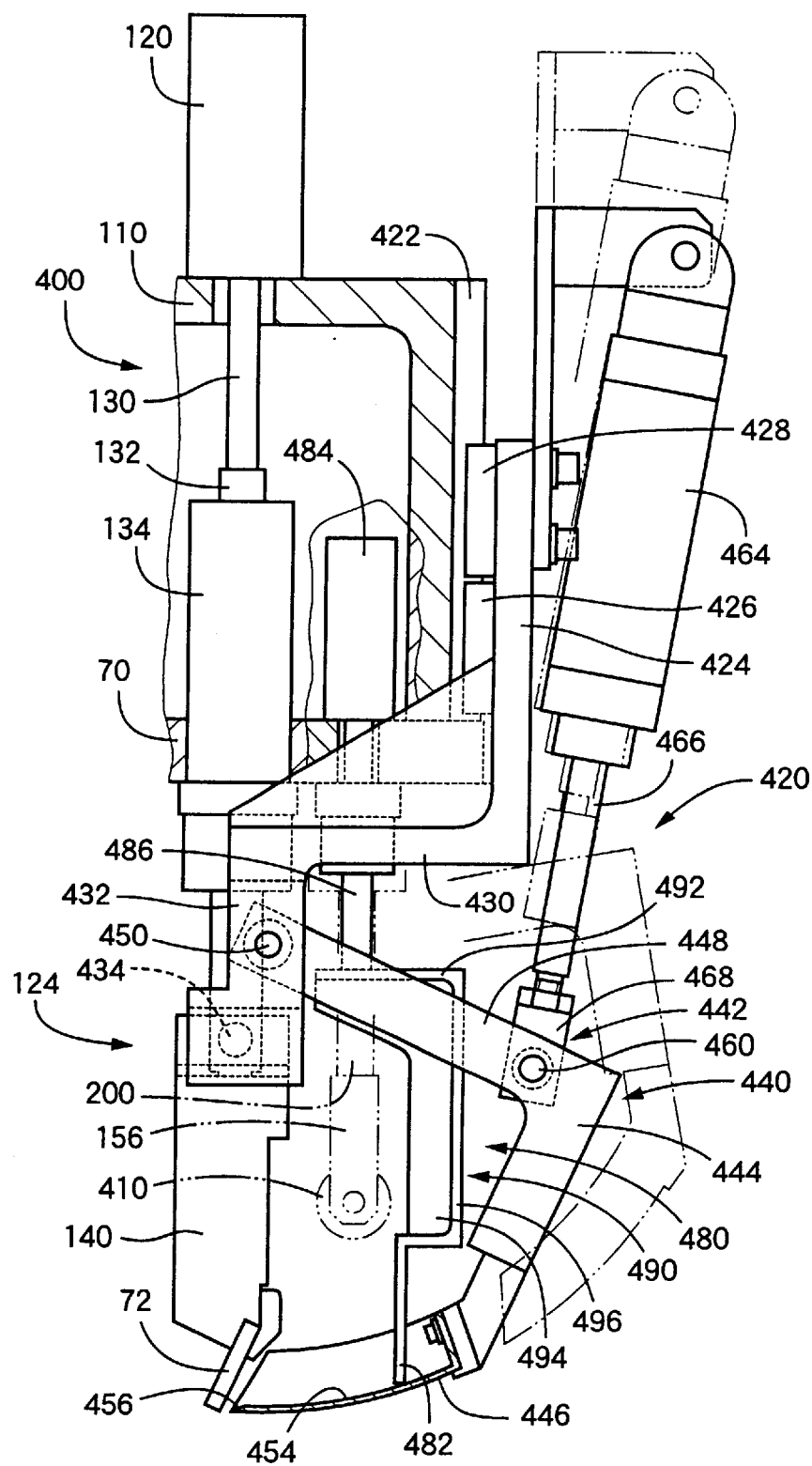
FIG. 6 is a partly cross-sectioned, front elevation view of the squeegee, one of the mask-press members, and a solder collecting device of the screen printing machine of FIG. 5.

An elevator portion 124 of the squeegee unit 400 includes a solder collecting device 420, shown in FIG. 6, which is movable up and down, with the elevator portion 124, relative to a slide member 70. Since the solder collecting device 420 is well known in the art, the device 420 is just briefly described below.

A frame 110 includes a back wall which is located on the downstream side of the first press roller 410 in the screen-print direction. A pair of guide rails 422 (only one rail 422 is shown in FIG. 6) are fixed to the back wall of the frame 110, such that the two guide rails 422 vertically extend and are distant from each other in a Y-axis direction. An elevator plate 424 is fitted on the two guide rails 422 via respective guide blocks 426, 428, such that the elevator plate 424 is movable up and down. Two support plates 430 (only one plate 430 is shown) extend from widthwise opposite ends of a lower end portion of the elevator plate 424, in a direction opposite to the screen-print direction. The two support plates 430 are fitted in respective recesses (not shown) which are formed in the slide member 70, and include respective arm portions 432 which extend vertically downward and which are opposed to widthwise opposite side surfaces of a squeegee-hold member 140 of the squeegee unit 400, respectively. The two arm portions 432 have respective pins 434 which are fitted in respective holes formed in the side surfaces of the squeegee-hold member 140. Thus, the elevator plate 424 is integrally connected to the squeegee 72, and is moved up and down as a unit with the squeegee 72.

The two support plates 430 cooperate with each other to support a scooping device 440 such that the scooping device 440 is pivotable about a horizontal axis line parallel to the Y-axis direction. The scooping device 440 includes a pair of brackets 442 each having an L-shaped configuration, and a scoop member 446 fixed to respective one arms 444 of the two L-shaped brackets 442. The respective other arms 448 of the two L-shaped brackets 442 are fitted in respective elongate holes formed in the two support plates 430, and are supported by the same 430 via respective pins 450 such that the brackets 442 are pivotable about a common horizontal axis parallel to the Y-axis direction.

The scoop member 446 has a part-cylindrical scoop surface 454 having a knife edge 456 at its free end. The two brackets 442 are connected to each other by a horizontal rod 460, and a piston rod 466 of a scoop-member pivoting air cylinder 464 is pivotally connected via a joint member 468 to a lengthwise middle portion of the rod 460. When the piston rod 466 is extended out of, and retracted into, the air cylinder 464, the two brackets 442 are pivoted about the common axis line of the two pins 450. Thus, the scoop member 446 is moved along the print mask 44 to a retracted position thereof indicated at two-dot chain line and to an operative position, indicated at solid line, where the scoop member 446 can scoop the solder paste 152.

A scraping device 480 is provided between the squeegee unit 400 and the scooping device 440. The scraping device 480 includes a scraping member 482 and two scraping-member elevating and lowering air cylinders 484 (only one cylinder 484 is shown) each as an elevating and lowering device for elevating and lowering the scraping member 482. The two air cylinders 484 are supported by the slide member 70 such that each of the two cylinders 484 is located between the press-roller elevating and lowering air cylinder 170 and a corresponding one of the two guide rods 200, 202 associated with the press roller 410, and such that the two cylinders 484 are distant from each other in the Y-axis direction and are oriented downward. Respective piston rods 486 of the two air cylinders 484 extend downward through the thickness of the slide member 70, and are connected to respective one arms 492 of two L-shaped brackets 490 by respective suitable fixing devices, such as fastening bolts. Each of the two L-shaped brackets 490 first extends in the direction opposite to the screen-print direction and then extends downward, thereby having the L-shaped configuration which does not interfere with the press roller 410. Each of the two brackets 490 is reinforced by a rib 494. The scraping member 482 is fixed to respective other arms 496 of the two brackets 490. In the example shown in FIG. 6, the brackets 490 and the scraping member 482 are integral with each other. However, it is possible to attach detachably the scraping member 482 to the brackets 490. The scraping member 482 is provided by a plate-like member, such that the scraper 482 extends in a direction (i.e., the Y-axis direction) perpendicular to the squeegee-move direction (i.e., the X-axis direction). The two brackets 490 are connected to each other by the scraper 482, and function as an integral member. When the piston rod 486 is extended out and retracted in, the scraper 482 is selectively moved to an operative position where the scraper 482 contacts the scoop surface 454 of the scoop member 446 being positioned at its operative position, and to a retracted position away from the scoop member 446.

When the present screen printing machine prints the solder paste 152 on the PWB 12, first, the print mask 44 is positioned and fixed, the slide member 70 is positioned at its print-start position, and the solder paste 152 is placed on the print mask 44, like in each of the illustrated embodiments. Then, the PWB 12 is conveyed and carried in, and is moved up by the PWB-support table 32 so that the PWB 12 is positioned close to the lower surface of the print mask 44. Subsequently, the press rollers 410, 412 are moved down to contact and press, against the PWB 12, a first and a second portion of the print mask 44 that precede and follow, in the screen-print direction, a third portion of the mask 44 that is to be pressed by the squeegee 72, and the squeegee 72 is moved down to contact and press the third portion of the mask 44. In this state, the slide member 70 is moved in the X-axis direction, so that the solder paste 152 is printed on the PWB 12 with high accuracy and stability like in each of the illustrated embodiments.

After the solder paste 152 is printed on one PWB 12, the scooping member 446 which has been kept at its retracted position is pivoted to its operative position indicated at solid line in FIG. 6, to scoop the solder paste 152 up from the print mask 44. Since, at this time, at least the press roller 410 out of the two press rollers 410, 412 has been moved up away from the mask 44 as indicated at two-dot chain line in FIG. 6, the scoop member 446 is allowed to move to its operative position. After the scoop member 446 scooped up the solder paste 152, both the squeegee 72 and the scoop member 446 are moved up. Sometime around the times when another PWB 12 is conveyed, carried in, and positioned, the slide member 70 is moved back to its print-start position. Subsequently, the squeegee 72 and the scoop member 446 are moved down, and the scrape member 482 is moved down to contact the scoop surface 454 of the scoop member 446. Then, the scoop member 446 is pivoted to its retracted position, so that the scraper 482 scrapes the solder paste 152 on the scoop surface 454, down onto the print mask 44. Then, the slide member 70 is moved by a small distance, so that the squeegee 72 collects the solder paste 152. Finally, the two press rollers 410, 412 are moved down to press, against the PWB 12, the preceding and following portions of the print mask 44 that precede and follow the squeegee 72. In this state, the slide member 70 is moved in the screen-print direction, so that the solder paste 152 is printed on the PWB 12.

However, it is possible to omit, like in the first embodiment shown in FIGS. 1 to 3, the press roller 412 as the following press member.

The solder collecting device 420 shown in FIG. 6 may be employed in each of the first embodiment shown in FIGS. 1 to 3 and the second embodiment shown in FIG. 4. When the solder paste has been printed on a predetermined number of PWBs 12, or when the current sort of PWBs 12 on each of which the solder paste 152 has been printed are changed to a new sort of PWBs 12, the current print mask 44 is changed to a new print mask 44 corresponding to the new sort of PWBs 12. However, if the solder paste 152 remains left on the current print mask 44 to be replaced with the new print mask 44, then the solder paste 152 will harden to adhere to the mask 44 and close the pattern holes 50 of the mask 44. Therefore, when the current print mask 44 is changed to the new print mask 44, it is preferred that the solder collecting device 420 collect the solder paste 152 left on the current mask 44.

In each of the three embodiments shown in FIGS. 1 to 6, the squeegee or squeegees 72 is or are moved relative to the PWB positioning and supporting device 16 and the mask positioning and supporting device 18. However, it is possible to move the two positioning and supporting devices 16, 18 relative to the squeegee or squeegees 72.

In each of the three embodiments, the squeegee is inclined relative to the print mask (i.e., print screen) 44. However, it is possible to make the squeegee 72 contact the print mask 44 perpendicularly thereto. The squeegee 72 may be formed of a different material than rubber, such as a synthetic resin and the lower end portion of the squeegee 72 that contacts the print mask 44 may have a different cross-sectional shape than rectangle, such as triangle or rhombus.

It is to be understood that the present invention may be embodied with other changes, modifications, and improvements, such as those described in SUMMARY OF THE INVENTION, which may occur to a person skilled in the art, without departing from the spirit and scope of the invention defined in the appended claims.

What is claimed is:

1. A printing apparatus, comprising:
    a supporting device having a support surface which supports an object;
    a mask holder which holds a print mask having a plurality of holes, such that the print mask is near, and substantially parallel, to the object supported by the support surface of the supporting device;
    a squeegee having a press surface which locally presses the print mask held by the mask holder against the object supported by the support surface;
    a moving device which moves, while the squeegee locally presses the print mask against the object supported by the support surface, at least one of the squeegee and a first combination of the supporting device and the mask holder relative to the other of the squeegee and the first combination, in a print direction along the support surface, so that the squeegee presses a print material placed on a surface of the print mask, along the surface of the print mask, and forces a portion of the print material into the holes of the print mask;
    a press roller which rolls on the surface of the print mask and which locally presses the print mask against the object, at a position distant from the press surface of the squeegee by a first predetermined distance which assures that the press roller does not contact the print material being pressed by the squeegee;
    a pressing-force adjusting device which adjusts a pressing force with which the press roller presses the print mask against the object; and
    a distance maintaining device which maintains, when the moving device moves, in the print direction, at least one of a second combination of the squeegee and the press roller and the first combination of the supporting device and the mask holder relative to the other of the second combination and the first combination, the first predetermined distance by which the press roller precedes the squeegee in the print direction.

2. An apparatus according to claim 1, wherein the moving device comprises:
    a movable holding member which holds at least one of the squeegee and the press roller; and
    a holding-member moving device which moves the holding member in the print direction parallel to the support surface of the supporting device that supports the object.

3. An apparatus according to claim 2, further comprising an elevating and lowering device which elevates and lowers the squeegee relative to the holding member, and thereby moves the squeegee in a first direction toward, and in a second direction away from, the support surface of the supporting device.

4. An apparatus according to claim 2, further comprising an elevating and lowering device which elevates and lowers the press roller relative to the holding member, and thereby moves the press roller in a first direction toward, and in a second direction away from, the support surface of the supporting device.

5. An apparatus according to claim 1, further comprising, in addition to the press roller as a preceding press roller, a following press roller which is distant from the squeegee by a second predetermined distance in a direction opposite to the print direction, and which locally presses the print mask against the object supported by the support surface, the second combination comprising the following press roller in addition to the squeegee and the preceding press roller.

6. An apparatus according to claim 1, wherein the pressing-force adjusting device comprises:
    a biasing device which applies, as the pressing force, a biasing force to bias the press roller toward the print mask; and
    a fluid-pressure operated actuator which adjusts the biasing force of the biasing device applied to the press roller.

7. A printing apparatus, comprising:
    a supporting device having a support surface which supports an object;
    a mask holder which holds a print mask having a plurality of holes, such that the print mask is near, and substantially parallel, to the object supported by the support surface of the supporting device;
    two squeegees each of which has a press surface which locally presses the print mask held by the mask holder against the object supported by the support surface;
    a moving device which moves, while each one of the two squeegees locally presses the print mask against the object supported by the support surface, at least one of said each squeegee and a first combination of the supporting device and the mask holder relative to the other of said each squeegee and the first combination, in a corresponding one of two opposite print directions along the support surface, so that said each squeegee presses a print material placed on a surface of the print mask, along the surface of the print mask, and forces a portion of the print material into the holes of the print mask;
    a mask-press member which is provided between the two squeegees and locally presses the print mask against the object, at a position distant from the press surface of said each squeegee by a first predetermined distance which assures that the mask-press member does not contact the print material being pressed by said each squeegee; and
    a distance maintaining device which maintains, when the moving device moves, in said one print direction, at least one of a second combination of said each squeegee and the mask-press member and the first combination of the supporting device and the mask holder relative to the other of the second combination and the first combination, the first predetermined distance by which the mask-press member precedes said each squeegee in said one print direction.

8. An apparatus according to claim 7, further comprising a pressing-force adjusting device which adjusts a pressing force with which the mask-press member presses the print mask against the object.

9. An apparatus according to claim 7, wherein the respective press surfaces of the two squeegees extend in a first direction perpendicular to the print directions and parallel to the surface of the object, and each of the press surfaces is inclined, relative to a plane extending in said first direction and a second direction perpendicular to the print directions and the surface of the object, and located between the two squeegees, such that a distance between said each press surface and said plane increases in a direction toward the surface of the object.

* * * * *